United States Patent
Shih

(10) Patent No.: US 8,158,891 B2
(45) Date of Patent: Apr. 17, 2012

(54) CIRCUIT BOARD STRUCTURE AND METHOD FOR MANUFACTURING THE SAME

(75) Inventor: Chao-Wen Shih, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 1123 days.

(21) Appl. No.: 11/898,103

(22) Filed: Sep. 10, 2007

(65) Prior Publication Data

US 2009/0065246 A1    Mar. 12, 2009

(51) Int. Cl.
*H05K 1/11* (2006.01)
(52) U.S. Cl. .................... 174/264; 257/698
(58) Field of Classification Search .......... 174/264–265, 174/260, 262, 263, 266; 361/792–795; 257/698–699
See application file for complete search history.

(56) References Cited

U.S. PATENT DOCUMENTS 7,370,412 B2 * 5/2008 Hiraoka et al. ............. 29/852

* cited by examiner

*Primary Examiner* — Jeremy Norris
(74) *Attorney, Agent, or Firm* — Bacon & Thomas, PLLC

(57) ABSTRACT

A circuit board disclosed in the present invention includes a core board on which a first circuit layer is placed, wherein the first circuit layer has a plurality of conductive pads; and at least one built-up structure covering the surface of the circuit board, which comprises a dielectric layer, a second circuit layer, and a plurality of conductive vias without being surrounded by annular metal rings. The conductive vias are conducted with the conductive pads of the first circuit layer and the second circuit layer. Besides, the surface of the second circuit layer is in the same height as the surface of the dielectric layer. Also, the present invention provides a method for manufacturing the above-mentioned circuit board structure. Therefore, a circuit board having fine circuits can be formed, and the shape of the circuit can be ensured efficiently. Moreover, electric performances of the circuit board can be improved.

18 Claims, 5 Drawing Sheets

CIRCUIT BOARD STRUCTURE AND METHOD FOR MANUFACTURING THE SAME

BACKGROUND OF THE INVENTION

1. Field of the Invention

The present invention relates to a circuit board and a method for manufacturing the same, and, especially, to a circuit board having fine circuits and a method for manufacturing the same.

2. Description of Related Art

Customer demands of the electronics industry continue to evolve rapidly and the main trends are high integration and miniaturization. In order to satisfy those requirements, especially in the packaging of semiconductor devices, development of circuit boards with the maximum of active and passive components and conductive circuit layers has progressed from double-layer to multi-layer types. This means that a greater circuit layout area is available due to interlayer connection technology so that the requirement of high-density integrated circuits can be satisfied. Therefore, the thickness of package substrates will be lessened, and more circuits and electric components can be included in the package substrates in the same area unit.

For the purpose of satisfying operation requirements from efficient chips of microprocessors, chip sets, graphics chips, and application-specific integrated circuits (ASIC), semiconductor package substrates have to improve communication of chip signals, bandwidth, and impedance so as to promote the development for high density I/O counts packages. Otherwise, package substrates are required to move towards fine circuits and small vias so as to benefit developments of compact dimension, multifunction, high speed, high circuit density, and high frequency. Nowadays, in conventional processes of semiconductor package substrates, circuit dimensions have been decreased from 100 μm to 30 μm or less. Besides, line width, line space, and aspect ratio have also been decreased under better alignment accuracy.

Built-up structure technologies have developed to advance circuit density of semiconductor package substrates. In other words, through built-up structure technologies, dielectric layers and circuit layers are stacked together on a surface of a core circuit board. In addition, conductive vias are disposed in the dielectric layers so as to interconnect the different circuit layers. Nevertheless, built-up structure technologies are the key point influencing circuit density of semiconductor package substrates. Currently, semi-additive processes (SAP) are generally used to fabricate built-up structures.

With reference to FIGS. 1a to 1f, there is a flow chart of semi-additive processes. First, a core board 10 is provided in FIG. 1a. A circuit layer 11 is formed on the upper and lower surfaces of the core board 10. A plurality of plated through holes 101 are formed in the core board 10 so as to conduct to the circuit layer 11 on the upper and lower surfaces of the core board 10, and those plated through holes 101 are filled with resin 12. As shown in FIG. 1b, a dielectric layer 13 is formed to totally cover the surfaces of the circuit layer 11 and the core board 10. Subsequently, a plurality of vias 131 are formed on the dielectric layer 13 in order to expose parts of the circuit layer 11 to serve as conductive pads 111 with reference to FIG. 1c. A seed layer 16 is formed on the dielectric layer 13 and inside the vias 131. Then, a patterned resistive layer 14 within open areas 141 is formed on the seed layer 16 in FIG. 1d. The whole core board 10 is put into an electroplating tank (not shown in figures). A metal layer is electroplated in the open areas 141 of the patterned resistive layer 14 by using the seed layer 16 as a conductive path of an electric current. As shown in FIG. 1f, the patterned resistive layer 14 is removed. Additionally, parts of the seed layer 16, covered by the patterned resistive layer 14, are removed by etching so that another circuit layer 151 and a plurality of conductive vias 152 are obtained. Herein, by way of repeating the foregoing processes to manufacture dielectric layers and circuit layers, a circuit board with multilayer built-up structure can be fabricated. However, some open areas 141 of the resistive layer 14 located above the vias 131 have to be greater than the vias 131 because of alignment accuracy in photolithography. Therefore, the conductive vias 152 manufactured through an electroplating process are surrounded by annular metal rings 152a which connect to the circuit layer 151 as shown in FIG. 1g (a top view of the dotted circle A in FIG. 1f).

In the foresaid SAP, the line width of the etched circuit layer 151 becomes less than that of the predetermined circuit layer 151 because the seed layer 16 covered by the patterned resistive layer 14 has to be removed by etching. Accordingly, the required stable quality of the circuit layer can not be achieved. In addition, inappropriate narrow circuits are manufactured under unstable manufacturing processes resulting in circuits being damaged. However, if the predetermined width of the circuit layer 151 is increased for avoiding the condition mentioned above, that will depart from the purpose for manufacturing fine circuits. Moreover, line space is also occupied by the annular metal rings 152a surrounding the conductive vias 152 so that the built-up structure with the circuit layer 151 on the surface of the dielectric layer 13 nowadays still has its bottlenecks unable to promote the processes capability of the fine circuits.

SUMMARY OF THE INVENTION

In view of the above conventional shortcomings, the object of the present invention is to provide a circuit board structure and a method for manufacturing the same so as to control circuits in predetermined shape efficiently, to form circuit boards having fine circuits, and to advance the electric performances of circuit boards in the same time.

In order to achieve the object mentioned above, the present invention provides a circuit board structure comprising: a core board having a first circuit layer thereon, wherein the first circuit layer has a plurality of conductive pads; and at least one built-up structure covering the surface of the core board, which comprises a dielectric layer, a second circuit layer, and a plurality of conductive vias without being surrounded by annular metal rings, wherein the conductive vias conduct to the conductive pads and the second circuit layer, and the surfaces of the second circuit layer, the conductive vias, and the dielectric layer are on the same plane.

Because the surfaces of the second circuit layer, the conductive vias, and the dielectric layer are on the same plane, circuits can be ensured in predetermined shape so that the circuit board can have fine circuits.

In the aforementioned circuit board structure, the conductive vias can be solid metal pillars. Besides, a seed layer is disposed between the dielectric layer and the second circuit layer, and between the dielectric layer and the conductive vias. The circuit board structure can further comprise an insulating protective layer covering an outer layer of the built-up structure, wherein the insulating protective layer has a plurality of openings by which parts of the conductive vias or parts of the second circuit layer in the outer layer of the built-up structure are exposed to serve as conductive pads. Preferably, the insulating protective layer can be a solder mask.

The two surfaces of the circuit board illustrated above can be a chip disposed side to attach the chip and a solder ball disposed side having solder balls to connect the printed circuit board, respectively.

In the above-mentioned circuit board structure, a substrate serves as a core of the core board, and the first circuit layer is formed on the surfaces of the substrate in which a plurality of plated through holes are formed and conduct to the first circuit layer formed on the surfaces of the substrate. Moreover, the number of layers in the core board is not limited to, but the core board can be double-sided circuit board or a multilayer circuit board. Nowadays, dielectric materials are generally filled with fillers in a large dimension (max=10 μm). This kind of dielectric material is disadvantageous to manufacture fine circuits, i.e. line width and line space are respectively smaller than 15 μm. However, the dielectric layer in the present invention is made of a photosensitive dielectric material having high resistivity so that electromigration or point discharge due to line space decreased can be moderated efficiently. Additionally, the dielectric layer can be processed by exposure and development to form openings. The photosensitive dielectric material can selectively further comprise at least one fine particle filler or without any filler so as to benefit fine circuit manufacturing.

The present invention further provides a method for manufacturing a circuit board structure comprising: providing a core board having a first circuit layer thereon, wherein the first circuit layer has a plurality of conductive pads; forming a dielectric layer covering the surfaces of the core board and the first circuit layer; forming a plurality of open areas for circuits on the dielectric layer, wherein parts of the open areas are drilled by laser ablation to form a plurality of vias exposing the conductive pads; forming a metal layer covering the surface of the dielectric layer, and the insides of the open areas and the vias; and removing parts of the metal layer higher than the surface of the dielectric layer so that other parts of the metal layer filled in the open areas and in the vias are formed respectively into a second circuit layer and a plurality of conductive vias, and a built-up structure is fabricated, wherein the conductive vias conduct to the conductive pads and the second circuit layer, and the surfaces of the second circuit layer, the conductive vias, and the dielectric layer are on the same plane.

In the method explained above, the conductive vias formed from the metal layer can be solid metal pillars. The open areas of the dielectric layer are formed by exposure and development, and then the vias are formed by laser ablation to expose the conductive pads of the first circuit layer. Furthermore, the depth of the open areas is less than that of the vias.

Other objects, advantages, and novel features of the invention will become more apparent from the following detailed description when taken in conjunction with the accompanying drawings.

DETAILED DESCRIPTION OF THE PREFERRED EMBODIMENT

Figure 1A:
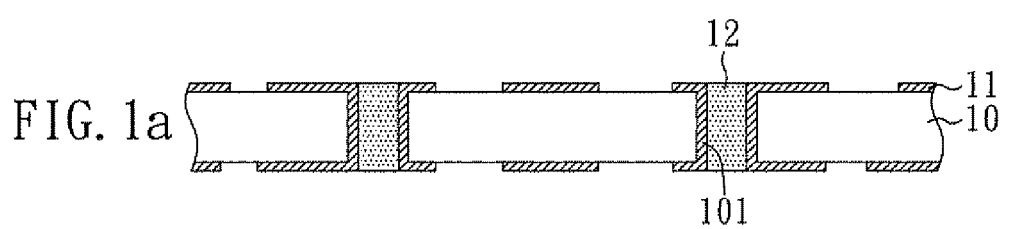
FIGS. 1a to 1f show a flow chart of conventional semi-additive processes.
Figure 1B:
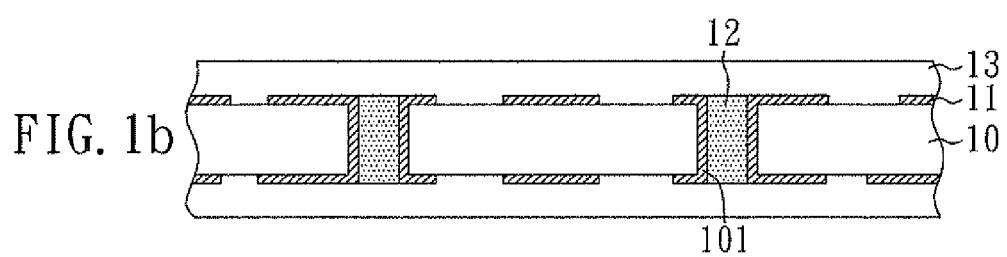
Figure 1C:
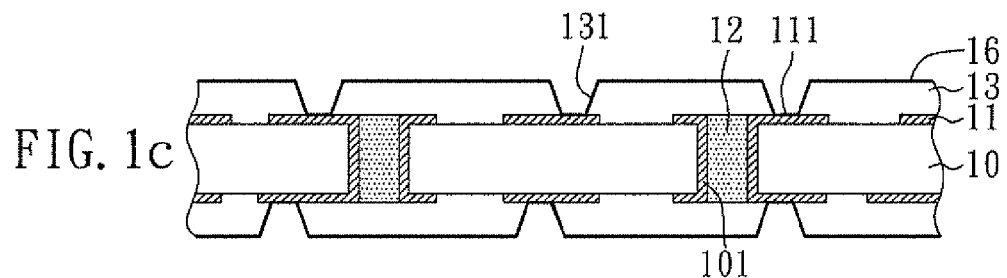
Figure 1D:
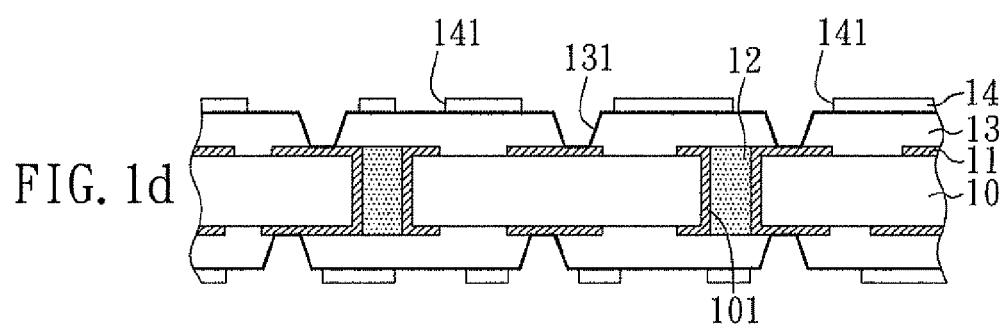
Figure 1E:
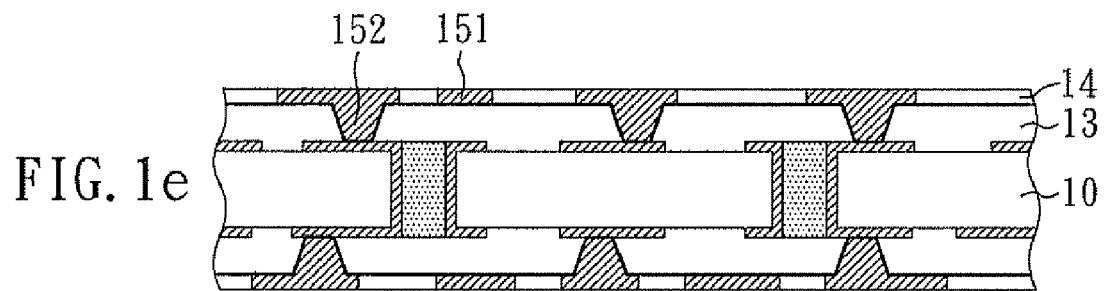

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

The drawings of the embodiments in the present invention are all simplified charts or views, and only reveal elements relative to the present invention. The elements revealed in the drawings are not necessarily aspects of the practice, and quantity and shape thereof are optionally designed. Further, the design aspect of the elements can be more complex.

Embodiment 1

With reference to FIGS. 2a to 2h, there is shown a flow chart of the method for manufacturing a circuit board structure in Embodiment 1 of the present invention.

Figure 2A:
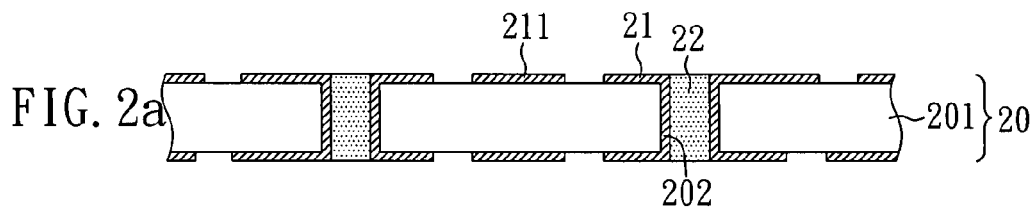
FIGS. 2a to 2h show a flow chart of the method for manufacturing a circuit board structure in Embodiment 1 of the present invention.

As shown in FIG. 2a, a core board 20 is provided. The core board 20 has a first circuit layer 21 respectively on the upper and lower surface. Besides, the first circuit layer 21 has a plurality of conductive pads 211. Therefore, the core board used in the present embodiment can be a double-sided circuit board or a multilayer circuit board, which has the first circuit layer 21. Besides, a substrate 201 serves as a core of the core board 20, and the first circuit layer 21 is formed on the upper and lower surfaces of the substrate 201 in which a plurality of plated through holes 202 are formed. The first circuit layer 21 formed on the surfaces of the substrate 201 is conducted with the plated through holes 202. In addition, the plated through holes 202 are filled with resin 22.

Figure 2B:
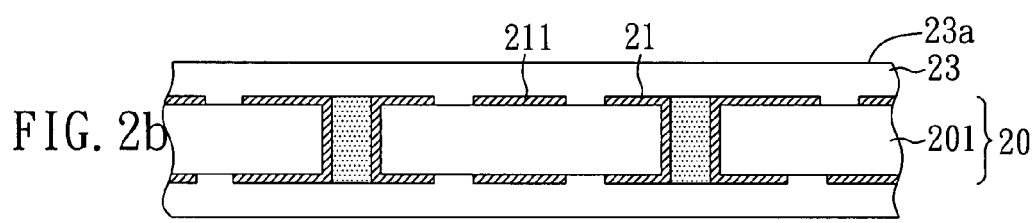

As shown in FIG. 2b, a dielectric layer 23 is formed to thoroughly cover the surfaces of the core board 20 and the first circuit layer 21 through printing, spin-coating, or laminating. In the present embodiment, the dielectric layer 23 is made of a photosensitive dielectric material having high resistivity, which is selectively added with at least one filler in small dimension.

Figure 2C:
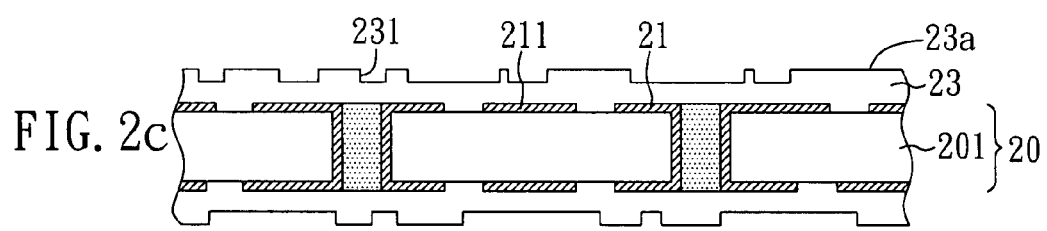

Then, with reference to FIG. 2c, a plurality of open areas 231 for circuits are formed on the dielectric layer 23 through exposure and development.

Figure 2D:
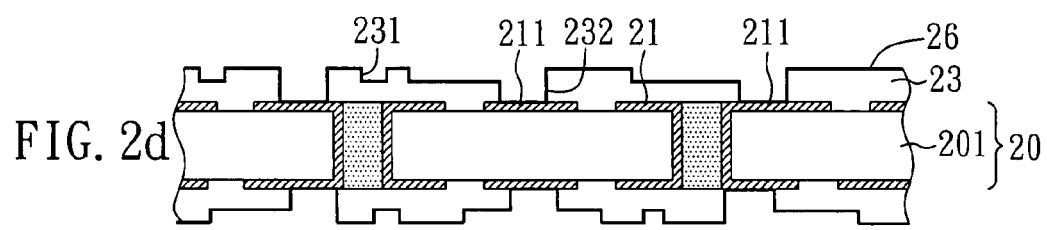

In FIG. 2d, parts of the open areas 231 are drilled by laser ablation and, subsequently a plurality of vias 232 are formed to expose the conductive pads 211. Through sputtering or electroless plating, a seed layer 26 is formed to cover the conductive pads 211 of the first circuit layer 21, the open areas 231, and the vias 232.

Figure 2E:
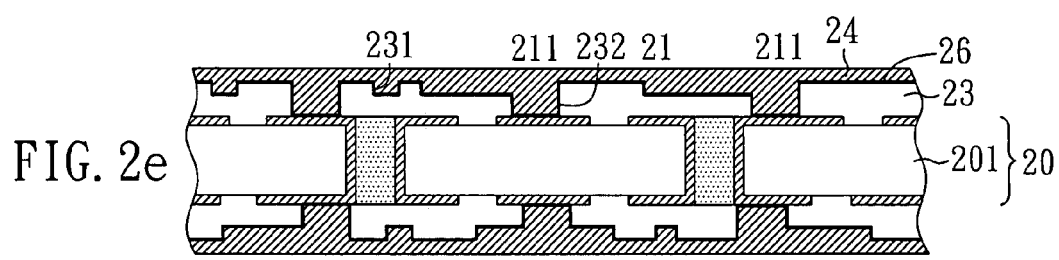

As shown in FIG. 2e, a metal layer 24 covering the surface of the dielectric layer 23, and the insides of the open areas 231 and the vias 232 by plating through current conducted by the seed layer 26. The metal layer 24 can be made of one selected from the group consisting of Pb, Sn, Ag, Cu, Au, Bi, Sb, Zn, Ni, Zr, Mg, In, Si, Te, Al, Ga, and the alloy thereof.

Figure 2F:
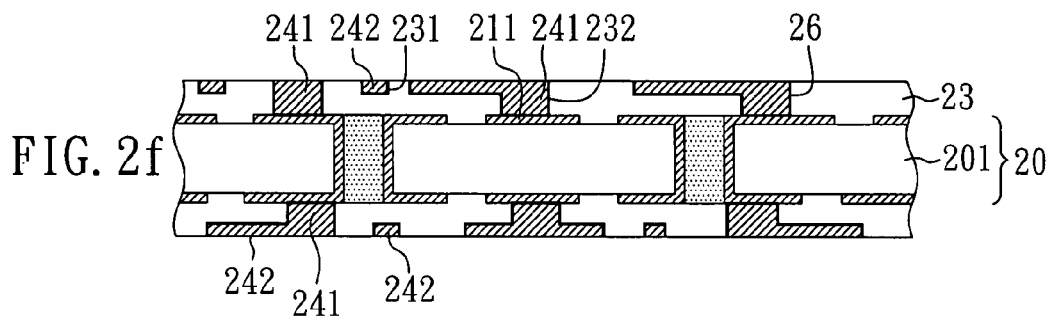

As shown in FIG. 2f, parts of the metal layer 24 higher than the surface 23a of the dielectric layer 23 are removed so that other parts of the metal layer filled in the open areas 231 and in the vias 232 are formed respectively into a second circuit layer 242 and a plurality of conductive vias 241. In detail, parts of the conductive vias 241 conduct to the conductive pads 211 of the first circuit layer 21 and the second circuit layer 242. Furthermore, the surfaces of the second circuit layer 242, the conductive vias 241, and the dielectric layer 23 are on the same plane. Through the foregoing processes, a built-up structure can be fabricated.

Moreover, the via 232 can be wholly filled with the anterior metal layer 24 formed by electroplating as shown in FIG. 2f. Hence, the conductive vias 241 are formed as solid metal pillars.

Besides, multilayer built-up structures can be formed by repeating the aforesaid processes as shown in FIGS. 2b to 2f if necessary. Therefore, the circuit board structure of the present invention can be fabricated as shown in FIG. 2g, and it comprises a core board 20 having a first circuit layer 21 thereon, wherein the first circuit layer 21 has a plurality of conductive pads 211; and at least one built-up structure covering the surface of the core board 20, which comprises a dielectric layer 23, a second circuit layer 242, and a plurality of conductive vias 241 without being surrounded by annular metal rings, wherein the conductive vias 241 conduct to the conductive pads 211 and the second circuit layer 242, and the surfaces of the second circuit layer 242, the conductive vias 241, and the dielectric layer 23 are on the same plane.

Figure 2G:
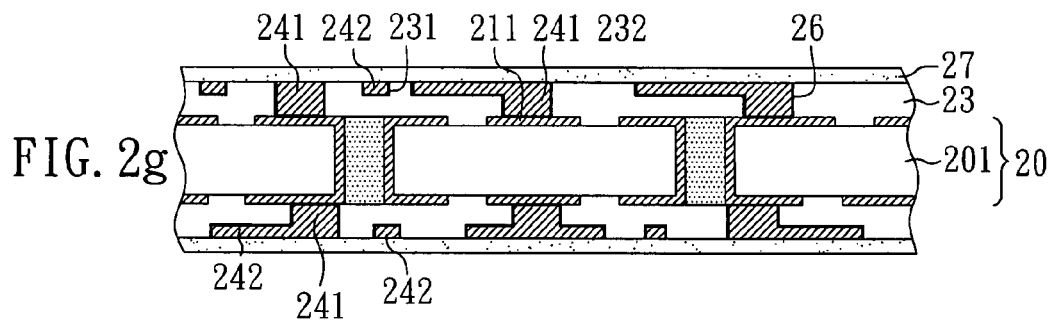
Figure 2H:
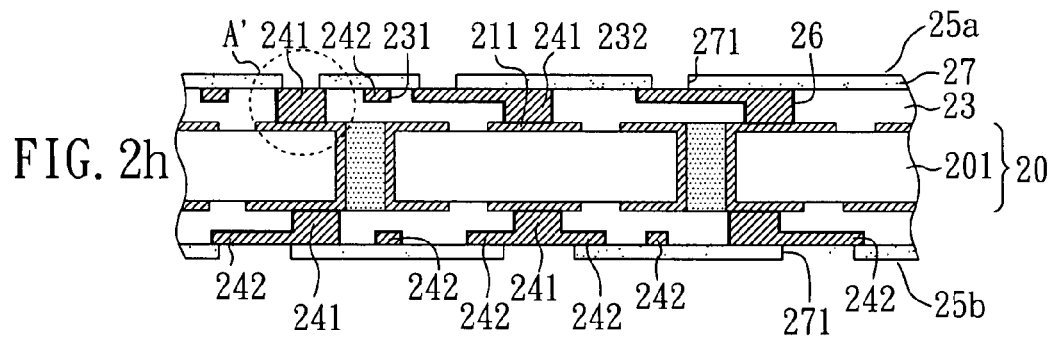

With reference to FIG. 2g, an insulating protective layer 27 is formed on the dielectric layer 23, the conductive vias 241, and the second circuit layer. Subsequently, a plurality of openings 271 are formed on the insulating protective layer 27 as shown in FIG. 2h. Parts of the conductive vias 241 and the second circuit layer 242 in the outer layer of the built-up structure are exposed by the openings 271 to serve as conductive pads. In the present embodiment, the insulating protective layer 27 is a solder mask.

Figure 1F:
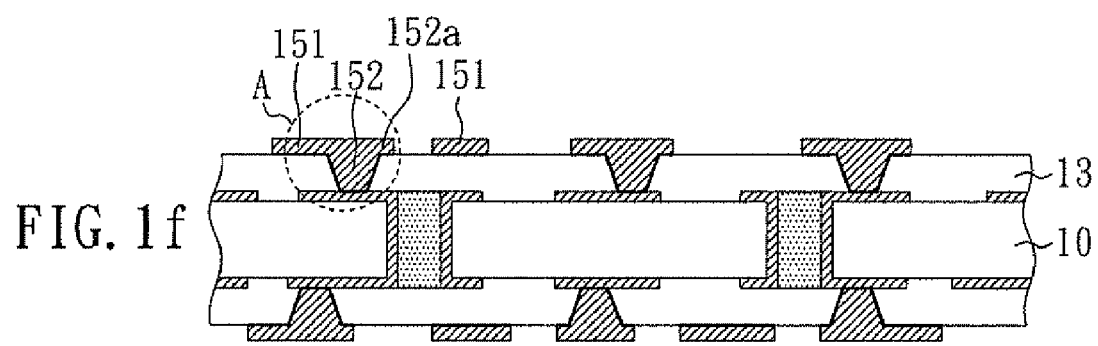
Figure 1G:
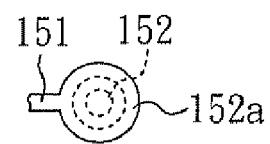
FIG. 1g is a top view of the dotted circle A in the FIG. 1f.
Figure 2I:
FIG. 2i is a top view of the dotted circle A' in the FIG. 2h.

In FIG. 2h, two surfaces of the circuit board structure respectively are a chip disposed side 25a and a solder ball disposed side 25b. Parts of the conductive vias 241 or parts of the second circuit layer 242 serve as conductive pads of the chip disposed side 25a. These conductive pads are used for disposed of solder bumps connecting to semiconductor chips. FIG. 2i is a top view of the dotted circle A' in FIG. 2h. In FIG. 2i, the conductive vias 241 of the chip disposed side 25a are not surrounded by the annular metal rings 152a as illustrated in the background of the present invention and as shown in FIGS. 1f and 1g.

The other surface is the solder ball disposed side 25b that is used for disposed of solder balls connecting to printed circuit boards. Parts of the conductive vias 241 and the second circuit layer 242 serve as conductive pads of the solder ball disposed side 25b. Especially, the solder balls on the solder ball disposed side 25b are quite greater in dimension than the conductive vias 241 so as to benefit connection to the printed circuit boards. The peripheries of conductive vias 241 on the solder ball disposed side 25b are connected with the second circuit layer 242. However, these conductive vias 241 on the solder ball disposed side 25b are the same as those on the chip disposed side 25a are not surrounded by the annular metal rings.

The conductive pads, formed from exposure of parts of the conductive vias 241 or parts of the second circuit layer 242 by the openings 271 formed on the insulating protective layer 27 are defined as follows.

First definition is as shown in FIG. 2h. The insulating protective layer 27 having the openings 271 partially covers the peripheries of the conductive pads both on the chip disposed side 25a and on the solder ball disposed side 25b. This kind of the conductive pads is described as a solder mask defined pad (SMD pad).

Figure 3:
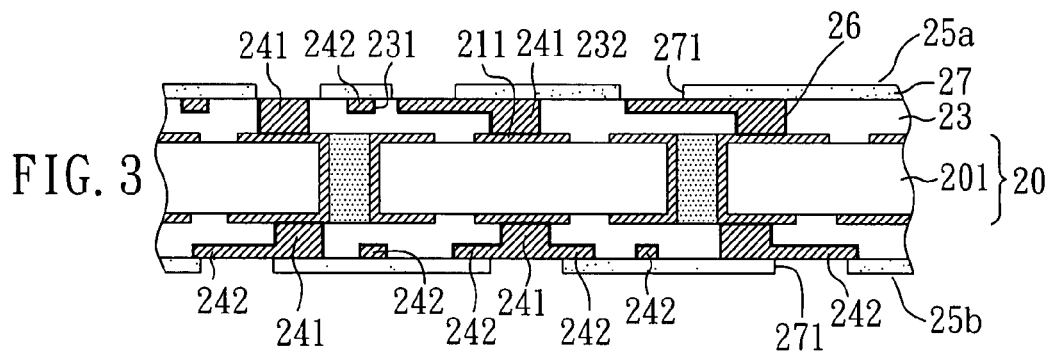
FIG. 3 is a perspective view of the circuit board structure in the embodiment of the present invention.

Second definition is as shown in FIG. 3. The insulating protective layer 27 having the openings 271 does not cover and contact the peripheries of the conductive pads on the chip disposed side 25a. This kind of conductive pad is described as a non-solder mask defined pad (NSMD pad). The conductive pads on the solder ball disposed side 25b are partially covered by the insulating protective layer 27 having the openings 271.

Figure 4:
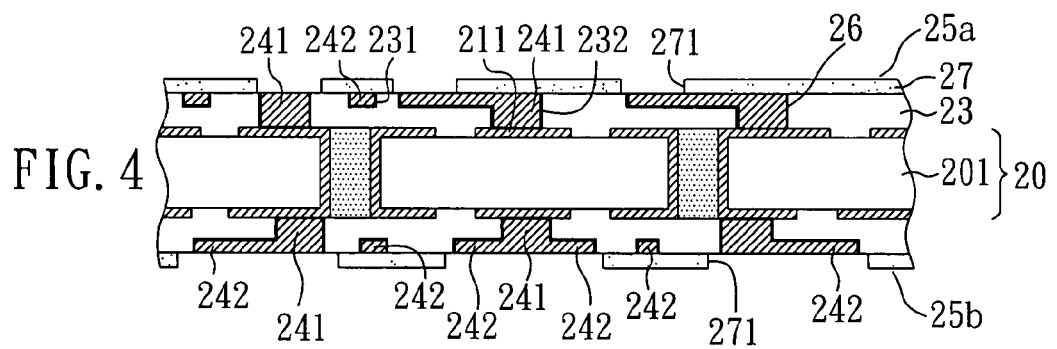
FIG. 4 is a perspective view of the circuit board structure in the embodiment of the present invention.

Third definition is as shown in FIG. 4. The insulating protective layer 27 having the openings 271 does not cover and contact the peripheries of the conductive pads both on the chip disposed side 25a and on the solder ball disposed side 25b.

Figure 5:
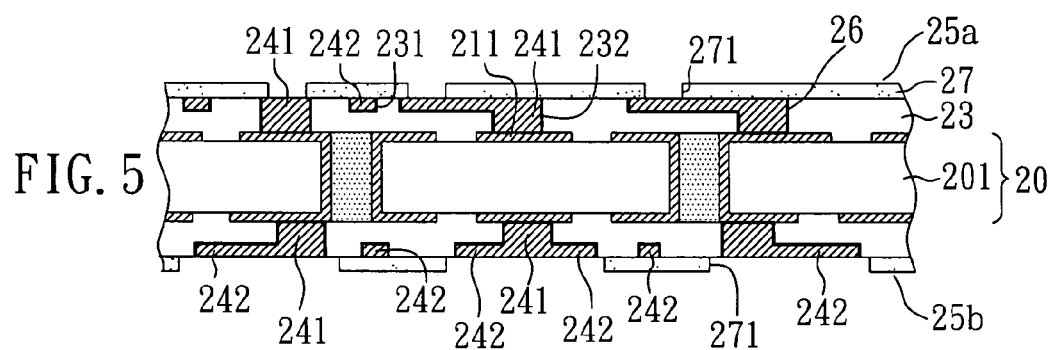
FIG. 5 is a perspective view of the circuit board structure in the embodiment of the present invention.

Fourth definition is as shown in FIG. 5. The insulating protective layer 27 having the openings 271 partially covers the peripheries of the conductive pads on the chip disposed side 25a, but does not cover and contact the peripheries of the conductive pads on the solder ball disposed side 25b.

Hence, in the circuit board structure and the method for manufacturing the same in the present invention, circuits can be ensured in a predetermined shape because the surfaces of the second circuit layer 242, the conductive vias 241, and the dielectric layer 23 are on the same plane. The circuit board having fine circuits can be fabricated, and that can promote electric performances.

Although the present invention has been explained in relation to its preferred embodiment, it is to be understood that many other possible modifications and variations can be made without departing from the scope of the invention as hereinafter claimed.

What is claimed is:

1. A multilayer packaging substrate structure comprising:
   a core board having a first circuit layer on opposite surfaces thereof, wherein the first circuit layer has a plurality of conductive pads; and
   a built-up structure covering each of the opposite surfaces of the core board, and comprising at least one dielectric layer, a second circuit layer with sides-and-bottom-embedded in and top-exposed from the at least one dielectric layer, and a plurality of conductive vias disposed in the at least one dielectric layer without being surrounded by annular metal rings and conducting the conductive pads and the second circuit layer, and the surfaces of the second circuit layer, the conductive vias, and the dielectric layer are on the same plane,
   wherein the multilayer packaging substrate structure has a chip-disposed side used for connecting to a semiconductor chip and a ball-disposed side used for connecting to a printed circuit board.

2. The multilayer packaging substrate structure as claimed in claim 1, wherein a seed layer is disposed between the at least one dielectric layer and the second circuit layer, and between the at least one dielectric layer and the conductive vias.

3. The multilayer packaging substrate structure as claimed in claim 1, further comprising an insulating protective layer covering an outer layer of the built-up structure, wherein the insulating protective layer has a plurality of openings by which parts of the conductive vias in the outer layer of the built-up structure are exposed to serve as conductive pads.

4. The multilayer packaging substrate structure as claimed in claim 1, further comprising an insulating protective layer covering an outer layer of the built-up structure, wherein the insulating protective layer has a plurality of openings by which parts of the second circuit layer in the outer layer of the built-up structure are exposed to serve as conductive pads.

5. The multilayer packaging substrate structure as claimed in claim 1, wherein the second circuit layer, the first circuit layer and the conductive vias are made of one selected from the group consisting of Pb, Sn, Ag, Cu, Au, Bi, Sb, Zn, Ni, Zr, Mg, In, Si, Te, Al, Ga, and the alloy thereof, and the conductive vias are solid metal pillars.

6. The multilayer packaging substrate structure as claimed in claim 1, wherein a substrate serves as a core of the core board, and the first circuit layer is formed on the surfaces of the substrate in which a plurality of plated through holes are formed and conduct to the first circuit layer formed on the surfaces of the substrate.

7. The multilayer packaging substrate structure as claimed in claim 1, wherein the at least one dielectric layer is made of a photosensitive dielectric material having high resistivity.

8. The multilayer packaging substrate structure as claimed in claim 7, wherein the photosensitive dielectric material further comprises at least one fine particle filler or without any filler.

9. A method for manufacturing a multilayer packaging substrate structure comprising:
   providing a core board having a first circuit layer on each of opposite surfaces thereof, wherein the first circuit layer has a plurality of conductive pads;
   forming a dielectric layer covering the first circuit layer and each of the opposite surfaces of the core board;
   forming a plurality of trenches for circuits on the dielectric layer, wherein parts of trenches are drilled by laser ablation to form a plurality of vias exposing the conductive pads;
   forming a metal layer covering the surface of the dielectric layer, and filling the insides of the trenches and the vias; and
   removing parts of the metal layer higher than the surface of the dielectric layer so that other parts of the metal layer filling the trenches and the vias are formed respectively into a second circuit layer with sides-and-bottom-embedded in and top-exposed from the dielectric layer and a plurality of conductive vias disposed in the dielectric layer without being surrounded by annular metal rings and conducting the conductive pads and the second circuit layer, wherein the previous forming-a-dielectric layer step to this step can be repeated regarding needs so that a built-up structure is fabricated on each of opposite surfaces of the core board,
   wherein the multilayer packaging substrate structure has a chip-disposed side used for connecting to a semiconductor chip and a bail-disposed side used for connecting to a printed circuit board.

10. The method as claimed in claim 9, wherein the trenches of the dielectric layer are formed by exposure and development, and then the vias are formed by laser ablation to expose the conductive pads.

11. The method as claimed in claim 9, further comprising forming a seed layer between the dielectric layer and the metal layer.

12. The method as claimed in claim 9, further comprising forming an insulating protective layer on the dielectric layer and the second circuit layer, wherein the insulating protective layer has a plurality of openings by which parts of the conductive vias in the outer layer of the built-up structure are exposed to serve as conductive pads.

13. The method as claimed in claim 9, further comprising forming an insulating protective layer on the dielectric layer and the second circuit layer, wherein the insulating protective layer has a plurality of openings by which parts of the second circuit layer in the outer layer of the built-up structure are exposed to serve as conductive pads.

14. The method as claimed in claim 9, wherein the metal layer is made of one selected from the group consisting of Pb, Sn, Ag, Cu, Au, Bi, Sb, Zn, Ni, Zr, Mg, In, Si, Te, Al, Ga, and the alloy thereof.

15. The method as claimed in claim 9, wherein a substrate serves as a core of the core board, and the first circuit layer is formed on the surfaces of the substrate in which a plurality of plated through holes are formed and conduct to the first circuit layer formed on the surfaces of the substrate.

16. The method as claimed in claim 9, wherein the dielectric layer is made of a photosensitive dielectric material having high resistivity.

17. The method as claimed in claim 16, wherein the photosensitive dielectric material further comprises at least one fine particle filler or without any filler.

18. The method as claimed in claim 9, wherein the depth of the trenches is less than that of the vias.

* * * * *